United States Patent [19]

Sempel

[11] Patent Number: 4,937,516
[45] Date of Patent: Jun. 26, 1990

[54] BALANCED VOLTAGE-CURRENT CONVERTER AND DOUBLE-BALANCED MIXER CIRCUIT COMPRISING SUCH A CONVERTER

[75] Inventor: Adrianus Sempel, Eindhoven, Netherlands

[73] Assignee: U.S. Philips Corporation, New York, N.Y.

[21] Appl. No.: 266,173

[22] Filed: Nov. 2, 1988

[30] Foreign Application Priority Data

Nov. 13, 1987 [NL] Netherlands ............ 8702716

[51] Int. Cl.$^5$ ............................................. G05F 3/16
[52] U.S. Cl. .................................... 323/315; 307/529; 330/252
[58] Field of Search .................. 323/312, 315, 316; 330/252, 254, 149; 307/520, 498, 529; 381/94

[56] References Cited

U.S. PATENT DOCUMENTS

| Re. 30,572 | 4/1981 | Steckler | 330/252 |
|---|---|---|---|
| 3,962,592 | 6/1976 | Thommen et al. | 323/315 X |
| 4,290,025 | 9/1981 | van de Plassche | 330/254 |
| 4,490,685 | 12/1984 | Sano | 330/252 |
| 4,513,242 | 4/1985 | Yokogawa | 381/94 X |
| 4,536,717 | 8/1985 | Hauge et al. | 330/254 |
| 4,636,663 | 1/1987 | Jongepier et al. | 307/498 X |
| 4,682,098 | 7/1987 | Seevinck et al. | 323/315 |

FOREIGN PATENT DOCUMENTS

| 0107118 | 6/1985 | Japan | 323/312 |
|---|---|---|---|
| 2107947 | 5/1983 | United Kingdom | 330/252 |

OTHER PUBLICATIONS

Turner, "Differential Amplifier Provides AGC Control", Electronic ..., vol. 12, No. 5, Mar. 2, 1964, p. 3.

Primary Examiner—Peter S. Wong
Assistant Examiner—Kristine Peckman
Attorney, Agent, or Firm—Edward W. Goodman

[57] ABSTRACT

The collectors of two transistors $T_5$ and $T_6$ constitute a first and a second collector terminal to which a load circuit can be connected. The base signal currents of $T_5$ and $T_6$ are added to their collector signal currents or subtracted from their emitter signal currents by a first difference pair $T_7$, $T_8$ and a second difference pair $T_9$, $T_{10}$. The signal current in the first and the second collector terminal is thus very accurately equal to the input signal current at the emitters of $T_5$ and $T_6$. Due to the high voltage gain of the first and the second difference pair, $T_5$ and $T_6$ are substantially completely turned on. A double-balanced mixer circuit having a large dynamic range is provided by a load circuit having two cross-coupled differential amplifiers $T_1$, $T_2$ and $T_3$, $T_4$.

14 Claims, 6 Drawing Sheets

BALANCED VOLTAGE-CURRENT CONVERTER AND DOUBLE-BALANCED MIXER CIRCUIT COMPRISING SUCH A CONVERTER

BACKGROUND OF THE INVENTION

1. Field of the Invention

The invention relates to a balanced voltage-current converter, comprising a first and a second transistor whose collectors constitute a first and a second collector terminal, respectively, for a load circuit connected to a common first power supply terminal and whose emitters are each connected to a common second power supply terminal by means of a current supply element, said emitters constituting inputs of the voltage-current converter.

The invention also relates to a double-balanced mixer circuit comprising such a voltage-current converter.

2. Description of the Related Art

A voltage-current converter of this type having a load circuit in the form of a mixer circuit connected thereto is known from European patent application EP-A1-0131337 and is used, inter alia, in radio and television receivers and in receivers for mobile communication. The radio frequency (RF) signal from, for example, an antenna is applied in phase opposition to the input terminals of the first and second transistors of the voltage-current converter and converted thereby into a proportional current variation which is superimposed via the first and second collector terminals, respectively, on the emitter currents of the transistors of two difference pairs connected thereto. A mixer signal applied to these difference pairs switches their transistors so that signals having the sum of and the difference between the frequencies of the mixer signal and the radio-frequency signal are present on the collectors of the difference pairs. The signal having the difference between the frequencies, which is an intermediate frequency (IF) signal, can be taken off by means of a bandpass or low-pass filter for further processing.

In such a mixer circuit non-linearities produce inter-modulation products and noise which directly influence the dynamic range of the receiver. The dynamic range which is free from intermodulation is defined as the difference, expressed in dB, between the minimum signal power required for noticeable reception and the maximum signal power for which reception, which is not interfered with by intermodulation products, is possible. It has been found that the quality of the voltage-current converter mainly determines the quality of the mixer circuit, that is to say, the dynamic range.

In the mixer circuit known from the above-mentioned European patent application EP-A1-0131337, the first and second transistors of the voltage-current converter are arranged in a common base configuration. The noise and distortion produced by the mixer circuit are largely determined by these transistors and the impedance of the signal source arranged between the input terminals of the voltage-current converter.

The dynamic range of the mixer circuit can be increased by increasing the bias current of these transistors so that the ratio between the impedance of the RF signal source and the impedance of these transistors, viewed at the input terminals of the voltage-current converter, is increased so that these transistors are driven to a relatively small extent. However, this solution has the drawback that the impedance of these transistors is not constant, which also causes distortion.

Moreover, the bias current in integrated circuits cannot be increased without problems because it is usually limited to a predetermined value in connection with dissipation requirements.

SUMMARY OF THE INVENTION

It is therefore an object of the invention to provide a voltage-current converter which has a larger linear range (larger dynamic range) so that, for example, an improvement of both the intermodulation and the noise behavior is obtained when it is used, for example, in a double-balanced mixer circuit. According to the invention, this is achieved in that the voltage-current converter also comprises a first difference pair comprising a third and a fourth transistor whose emitters are connected to a common first emitter terminal, a second difference pair comprising a fifth and a sixth transistor whose emitters are connected to a common second emitter terminal, said first and second emitter terminals each being connected to the second power supply terminal by means of current supply element, the bases of the fourth and the fifth transistors being coupled, to the emitters of the first and the second transistors respectively, the collectors of the third and the sixth transistors being coupled to the first and second collector terminals, respectively, or to the emitters of the first and the second transistors, respectively, and the collectors of the fourth and the fifth transistors being coupled to the bases of the first and the second transistors, respectively, each collector being connected to the first power supply terminal by means of a current supply element.

The invention is based on the recognition that the portion of the input signal current flowing in the bases of the first and the second transistors, is added to the respective collectors of the first and the second transistors by means of the first and the second difference pairs, respectively, or that it is subtracted from the emitter currents thereof. It is achieved thereby that the signal current in the first and second collector terminals is very accurately equal to the input signal current of the first and the second transistors, respectively. The logarithmic base-emitter voltage of these transistors is supplied by the fourth and the fifth transistors, respectively, each of which has a high voltage gain. This means that the first and the second transistor can be almost fully turned on so that the dynamic range of the balanced voltage-current converter according to the invention is larger than that of the converter as is used in the known double-balanced mixer circuit.

The noise produced by the circuit according to the invention is mainly determined by the transistors of the first and the second difference pairs. In a preferred embodiment of the invention, the noise contribution of these difference pairs is reduced in that the bases of the third and the sixth transistors are at a fixed potential as far as signal currents are concerned via a seventh and an eighth transistor, respectively, whose emitters are connected to ground with respect to the signal current, the bases of the third and the sixth transistors being coupled to the collectors of the seventh and the eighth transistors, respectively, which collectors being connected to the first power supply terminal by means of a current supply element and the bases of the seventh and the eighth transistor being connected to the bases of the fourth and the fifth transistors, respectively.

The operation of the seventh and the eight transistors may essentially be compared with that of broadband operational amplifiers whose bases constitute the inverting inputs and whose emitters constitute the non-inverting inputs, which amplifiers are negatively fed back via the first and the second difference pairs, respectively. This preferred embodiment of the invention has the advantage that the noise produced by the circuit is now mainly determined by the seventh and the eighth transistors which have a relatively low bias current so that their current noise contribution is small. As a result of the negative feedback, the input impedance of the voltage-current converter is further reduced in an electronic manner.

Since, as has already been stated, the fourth and the fifth transistors have a high voltage gain, it is desirable to make this gain narrow-band so as to prevent unstable behavior of the voltage-current converter according to the invention. In a further embodiment of the invention, this is achieved in that elements having a capacitive action are arranged between the base of the first transistor and the first emitter terminal and between the base of the second transistor and the second emitter terminal, respectively.

This arrangement does not yield any extra distortion because the considerably non-linear currents through these elements having a capacitive action flow in a closed loop through the fourth and the fifth transistors, respectively. The currents flowing in the first and second collector terminals remain equal to the respective input currents of the voltage-current converter.

To prevent further instabilities in the circuit according to the invention, the bandwidth of the respective feedback loops constituted by the first and the second difference pairs should be limited. In yet another embodiment of the invention, this is achieved in that the collectors of the seventh and the eighth transistors are each connected to ground by means of further elements having a capacitive action.

In yet another embodiment of the invention, the less favorable high-frequency properties of the third and the sixth transistors arranged as emitter followers can be improved in that further elements having a capacitive action are arranged between the base of the third transistor and the first emitter terminal and between the base of the sixth transistor and the second emitter terminal, respectively.

As already stated, the input signal is to be applied in phase opposition to the emitters of the first and the second transistors. If the signal source is designed with a floating source, it may be directly connected between the emitters. If one pole of the signal voltage source carries a fixed voltage, because it is connected, for example, to ground, the input voltage can be applied in phase opposition to the emitters in known manner by means of a transformer having one primary winding and two symmetrical secondary windings.

If the use of a transformer is difficult or undesirable, for example from a circuit-technical point of view, this drawback can be obviated in yet another embodiment of the invention in that the converter further comprises a third and a fourth difference pair comprising a seventh and a ninth and an eighth and a tenth transistor, respectively, the emitters of each difference pair being connected together and to the second power supply terminal via a current supply element the bases of the third and the sixth transistors being connected to the collectors of the seventh and the eighth transistors, respectively, which collectors are connected to the first power supply terminal by means of a current supply element, the bases of the seventh and the eighth transistors being connected to the bases of the fourth and the fifth transistors, respectively, the collectors of the ninth and the tenth transistors being coupled to the first power supply terminal with respect to the signal current and the bases of the ninth and the tenth transistors constituting the input terminals of the voltage-current converter.

The circuit thus formed has a high input impedance and by connecting one of the input terminals to ground, a non-floating signal source can be connected in a simple manner without the use of a transformer. This embodiment of the invention can be manufactured as one assembly in an integrated manner.

As described in the foregoing, a voltage-current converter according to the invention may advantageously be used in a double-balanced mixer circuit comprising a difference pair having an eleventh and a twelfth transistors whose emitters are connected together and which constitute a common emitter terminal, and a further difference pair having a thirteenth and a fourteenth transistor whose emitter are connected together and which constitute a common further emitter terminal, the collectors of the eleventh and the thirteenth transistors being connected together and constituting a common collector terminal, the collectors of the twelfth and the fourteenth transistors being connected together and constituting a common further collector terminal, each collector terminal being connected to the common first power supply terminal by means of an impedance, the bases of the eleventh and the fourteenth transistors being connected to a common base terminal, the bases of the twelfth and the thirteenth transistors being connected to a common further base terminal, between which base terminals a mixer signal can be applied, and the first and second collector terminals of the voltage-current converter being connected to the respective emitter terminals of the mixer circuit,

BRIEF DESCRIPTION OF THE DRAWINGS

The invention will now be described in greater detail, by way of example, with reference to the accompanying drawings, in which.

DESCRIPTION OF THE PREFERRED EMBODIMENT

Figure 1:
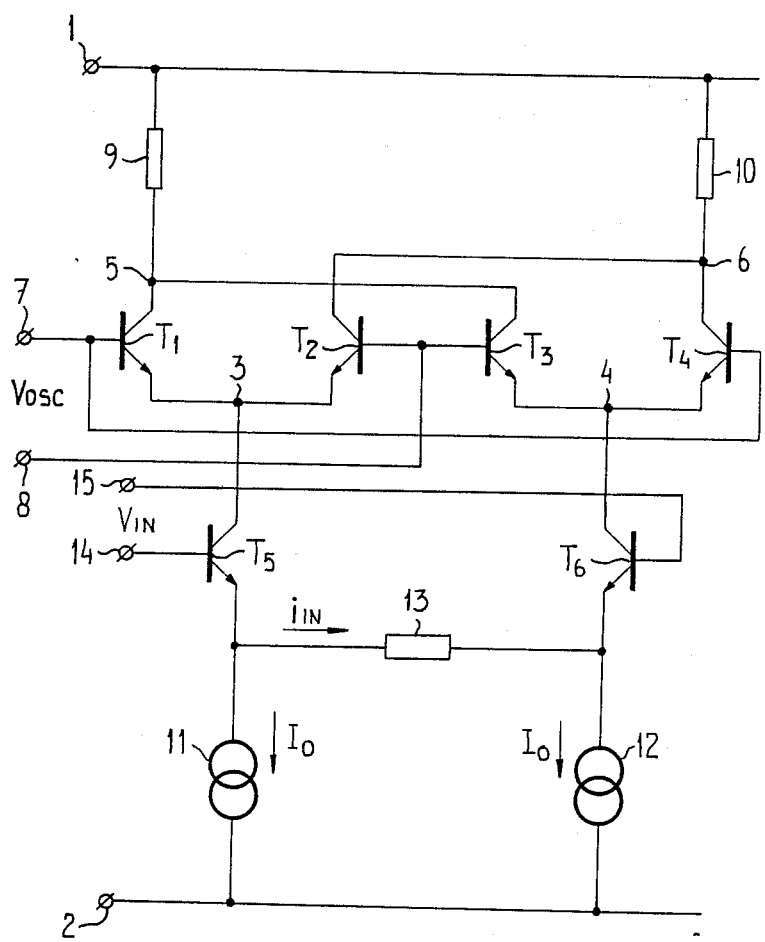
FIG. 1 is a basic circuit diagram of a double-balanced mixer circuit in which the input signal is applied to the bases of the transistors of the voltage-current converter.

The double-balanced mixer circuit shown in FIG. 1 comprises a difference pair which is constituted by the transistors $T_1$ and $T_2$ having a common first emitter terminal 3, and a further difference pair constituted by the transistors $T_3$ and $T_4$ having a common second emitter terminal 4. The bases of the transistors $T_1$ and $T_4$ are connected to a common first base terminal 7, while the bases of the transistors $T_2$ and $T_3$ are connected to a common second base terminal 8. The collectors of the transistors $T_1$ and $T_3$ are connected to a common first collector terminal 5, while the collectors of the transistors $T_2$ and $T_4$ are connected to a common second collector terminal 6. The collector terminal 5 is connected by means of an impedance 9 to a common first power supply terminal 1 and the common second collector terminal 6 is also connected to the first power supply terminal 1 by means of an impedance 10. The impedances 9 and 10 may be, for example resistors. An oscillator signal $v_{osc}$, by means of which, the transistors of the first and the second difference pairs are switched, is applied to the base terminals 7 and 8.

The voltage-current converter is constituted by the transistors $T_5$ and $T_6$. The RF input signal $v_{in}$ from, for example, an antenna is applied to input terminals 14 and 15 which are connected to the bases of the transistors $T_5$ and $T_6$, respectively, whose collectors are connected to the emitter terminal 3 and to the common second emitter terminal 4, respectively. The emitters of the transistors $T_5$ and $T_6$ are each connected, via current supply elements 11 and 12, respectively, to a common second power supply terminal 2. An impedance 13, for example in the form of a resistor, is arranged between the emitters of the transistors $T_5$ and $T_6$.

The common first power supply terminal 1 is connected to a positive pole of a voltage source and the common second power supply terminal 2 is connected to a negative pole.

The oscillator signal and the RF signal are mixed by means of the mixer circuit so that signals having the sum of and the difference between the frequencies of the oscillator signal and the RF signal appear at the common first and second collector terminals 5, 6. The signal having the difference between the frequencies i.e. the IF signal, can be taken off by means of a bandpass or lowpass filter.

The transistors $T_5$ and $T_6$ constitute a so-called voltage-current converter in which the signal voltage $v_{in}$ applied to the input terminals 14, 15 is converted into a proportional signal current $i_{in}$ through the impedance 13, which signal current flows via i.e. the emitter terminal 3 and the common second emitter terminal 4 because the current supply elements 11, 12 have an infinitely high impedance in the ideal case. In this Application, the term "current supply element" is understood to mean a circuit through which a given, substantially constant, direct current flows and whose impedance for alternating current is relatively large. Although in the circuit of FIG. 1 current sources are shown, the envisaged action can be alternatively realized, for example, by resistors of suitable value.

A mixer circuit of the type described above has the advantage that a satisfactory separation is obtained between the input signal, the output signal and the oscillator signal, that little oscillator power is required and that the circuit is integrable. Properties such as noise and distortion are largely determined by the transistors $T_5$, $T_6$ and the resistor 13. Known measures for improving these properties comprise the split-up of the conversion resistor 13 into a series arrangement of two resistors of half the value, while the two current supply elements 11, 12 are replaced by one current supply element of double the value connected between the junction point of the two resistors of half value and the second power supply terminal 2.

Figure 2:
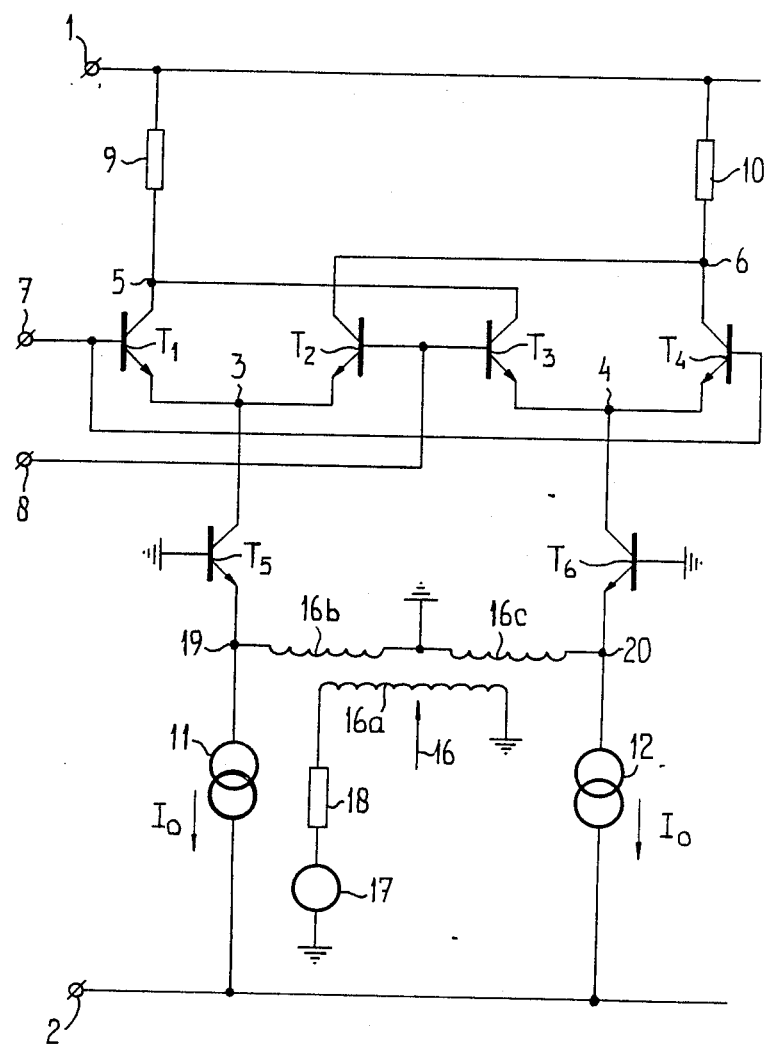
FIG. 2 is a basic circuit diagram of a double-balanced mixer circuit in which the transistors of the voltage-current converter are arranged in a common base configuration and in which the input signal is applied to their emitters via a transformer.

It has been found that the linearity and hence the intermodulation behavior as well as the noise, behavior can be improved by modifying the mode of driving the transistors $T_5$ and $T_6$ of the voltage-current converter, as is shown in FIG. 2. In this Figure, the bases of the transistors $T_5$ and $T_6$ are connected to ground with respect to the signal current, while the input signal is presented between their emitters, i.e. the input terminals 19 and 20, respectively. The dynamic range of the total mixer circuit in this embodiment is larger than that of the circuit of FIG. 1 because this is now substantially entirely determined by the dynamic range of the common base configuration thus formed.

If the RF signal originates from a so-called floating source, it can be connected in series with a conversion resistor to the input terminals 19, 20. Since the RF input signal usually comes from a voltage source 17 having a source impedance 18 with one pole of the source connected to ground, a floating source has to be created to drive the emitters of the transistors $T_5$ and $T_6$. In FIG. 2, this has been realized by means of a symmetrical transformer 16 which converts the RF input signal into two signals having opposite phases. The transformer 16 has a primary winding 16a one side of which is connected to ground and to the other side of which the RF signal source 17 is connected via a source impedance 18. The transformer 16 also comprises two secondary windings 16b and 16c having a common connection point which, as is shown, may be connected to ground and the other connection points of which are connected to the input terminals 19 and 20, respectively.

For obtaining optimum noise and intermodulation behavior, the linearity of the circuit can be adjusted by means of the ratio between the input impedance of the common base configuration and the source impedance of the signal source. The value of the input impedance of the common base configuration is dependent on the value of the bias current $I_0$ of the two current supply elements 11, 12. The value of the source impedance between the input terminals 19, 20 can be adjusted by means of the transformation ratio of the transformer 16. As already stated hereinbefore, the ratio between the transformed source impedance and the input impedance of the common base configuration should be chosen to be as large as possible in order to obtain a large linearity.

As already noted above, this circuit has the drawback that the input impedance of the common base configuration is not constant, which causes distortion. Moreover, by increasing the bias current of the transistors $T_5$ and $T_6$, the current noise contribution thereof is increased. As already stated previously, the value of the bias currents is limited in integrated circuits in connection with the heat dissipation of the entire circuit.

Figure 3:
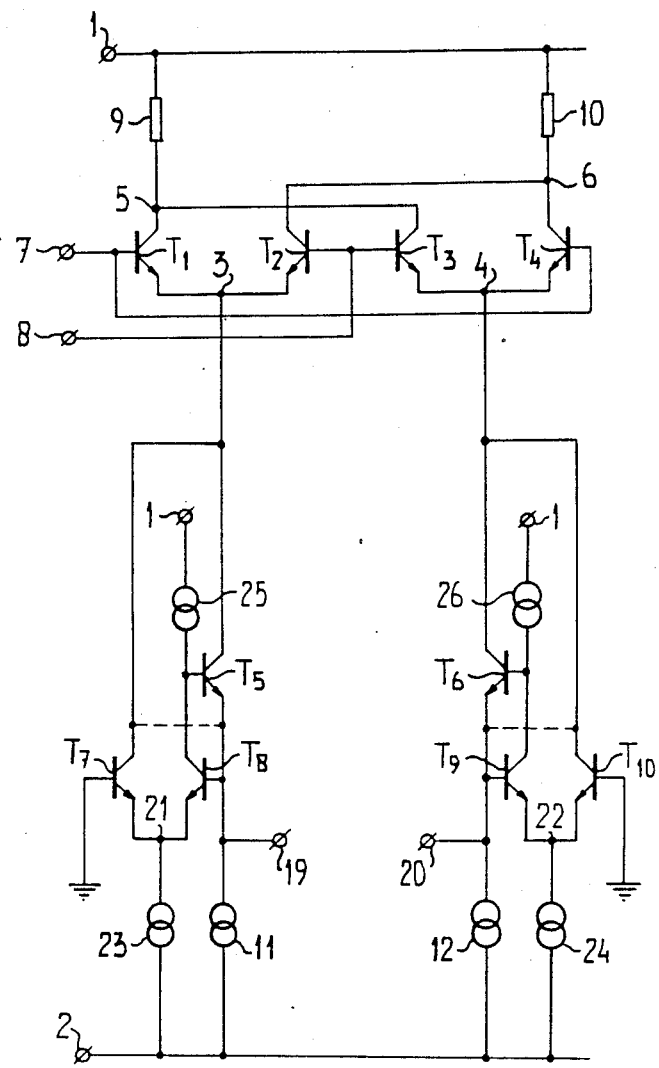
FIG. 3 is a basic circuit diagram of a double-balanced mixer circuit comprising a voltage-current converter according to the invention.

FIG. 3 shows the basic circuit diagram of an example of a double-balanced mixer circuit comprising a voltage-current converter according to the invention. In addition to the known transistors $T_5$ and $T_6$ described with reference to FIG. 2 the voltage-current converter also comprises two difference pairs constituted by the transistors $T_7$, $T_8$ and $T_9$, $T_{10}$, respectively. The emitters of the transistors $T_7$ and $T_8$ of the first difference pair are connected to a common first emitter terminal 21 and the emitters of the transistors $T_9$ and $T_{10}$ of the second difference pair are connected to a common second emitter terminal 22. The bases of the transistors $T_7$ and $T_{10}$ are connected to ground with respect to the signal current. The collectors of the transistors $T_5$ and $T_6$ constitute a first and a second collector terminal, respectively, to which the collectors of the transistors $T_7$ and $T_{10}$ and the common first emitter terminal 3 and the common second emitter terminal 4 of the circuit constituted by transistors $T_1$, $T_2$, $T_3$ and $T_4$ are connected. The collector of transistor $T_8$ is connected to the base of transistor $T_5$ and to the first power supply terminal 1 via a current supply element 25. The collector of transistor $T_9$ is connected to the base of transistor $T_6$ and also to the first power supply terminal 1 via a current supply element 26. The base of transistor $T_8$ is connected, with respect to the signal current, to the emitter of transistor $T_5$, and the base of transistor $T_9$ is connected, with respect to the signal current, to the emitter of transistor $T_6$. The first emitter terminal 21 and the second emitter terminal 22 are each connected by means of a current supply element, 23 and 24, respectively, to the second power supply terminal 2. An input signal $v_{in}$ can be applied in the manner described to the input terminals 19, 20.

The operation of the voltage-current converter according to the invention will hereinafter be described with reference to the portion of the circuit connected to the common first emitter terminal 3. Based on the symmetrical structure of the circuit, the portion connected to the common second emitter terminal 4 operates in a corresponding manner.

The logarithmic base-emitter voltage of transistor $T_5$ is supplied by transistor $T_8$ of the first difference pair. Assuming that the current supply element 25 is ideal, the signal current flowing in the collector lead of transistor $T_8$ is equal to the signal current in the base lead of transistor $T_5$. Assuming that the current supply element 23 is also ideal, the signal current flowing in the collector lead of transistor $T_7$ is substantially equal and opposite to the collector current of transistor $T_8$, thus in this case, it is equal to the base current of transistor $T_5$. Since the collector of transistor $T_7$ is connected to the common first emitter terminal 3, the total signal current flowing in this common first emitter terminal 3 is equal to the signal current in the emitter lead of transistor $T_5$. If the current flowing in the base leads of the transistors $T_7$ and $T_8$ is ignored, the input current of the circuit in the input terminal 19 is thus very accurately equal to the signal current in the collector terminal of the voltage-current converter connected to the emitter terminal 3.

Instead of connecting the collector of transistor $T_7$ to the first collector terminal of the voltage-current converter, it may alternatively be connected to the emitter of transistor $T_5$ as is shown by means of a broken line in FIG. 3. The signal current flowing in the collector lead of transistor $T_7$, which current is equal to the base current of transistor $T_5$ as far as its value is concerned, is then subtracted from the emitter current of $T_5$. If the signal currents in the base leads of the transistors $T_7$ and $T_8$ are ignored, it now also holds that the input current of the circuit in the input terminal 19 is very accurately equal to the signal current in the first collector terminal. Of course, in the balanced circuit, the collector of transistor $T_{10}$ should be connected in a corresponding manner to the emitter of transistor $T_6$.

The input impedance of the voltage-current converter between the input terminals 19, 20 is now much smaller due to the considerable negative feedback around the transistors $T_5$ and $T_6$ so that the distortion resulting from the variations in the input impedance of the circuit is reduced to a very considerable extent. Since the logarithmic base-emitter voltages of the transistors $T_5$ and $t_6$ are supplied by the transistors $T_8$ and $T_9$, respectively, which latter transistors have a high voltage gain, the transistors $T_5$ and $T_6$ can be substantially fully turned on so that the dynamic range of the mixer circuit is very large.

The noise produced by the circuit is mainly determined by the transistors of the first and the second difference pair. In the preferred embodiment of the invention shown in FIG. 4 further negative feedback is provided by means of the transistors $T_{11}$ and $T_{12}$ as compared with the embodiment of FIG. 3. The collector of transistor $T_{11}$ is connected to the base of transistor $T_7$ and to the first power supply terminal 1 via a current supply element 27. The emitter of transistor $T_{11}$ is connected to ground with respect to the signal current and its base is connected to the base of transistor $T_8$. The collector of transistor $T_{12}$ is connected to the base of transistor $T_{10}$ and to the first power supply terminal 1 via a current supply element 28. The emitter of transistor $T_{12}$ is also connected to ground with respect to the signal current and its base is connected to the base of transistor $T_9$. The transistors $T_{11}$ and $T_{12}$ arranged in this manner essentially function as broadband operational amplifiers in which the bases constitute the inverting inputs, the emitters constitute the non-inverting inputs and the collectors constitute the outputs. The operational amplifiers formed in this manner are negatively fed back via the first and second difference pairs, respectively.

The input impedance of the mixer circuit between the input terminals 19, 20 is further reduced with respect to the circuit of FIG. 3, while the noise is mainly determined by the transistors $T_{11}$ and $T_{12}$ which moreover have a relatively low bias current and consequently a low current noise contribution.

Figure 4:
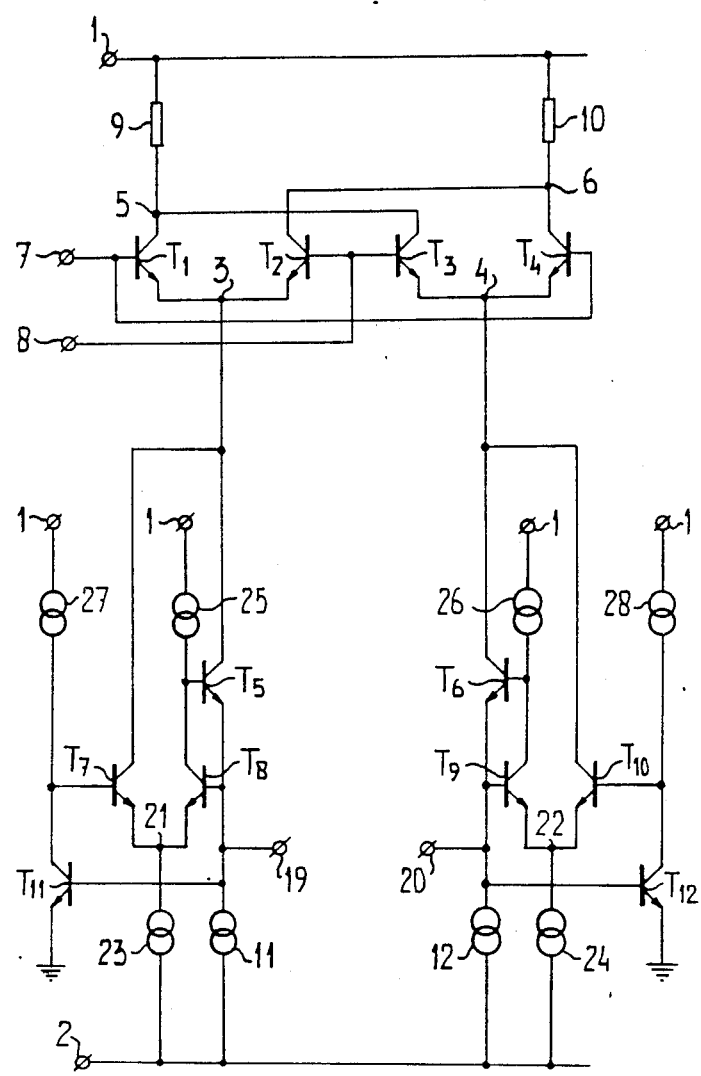
FIG. 4 is a basic circuit diagram of a double-balanced mixer circuit with a preferred voltage-current converter according to the invention.
Figure 5:
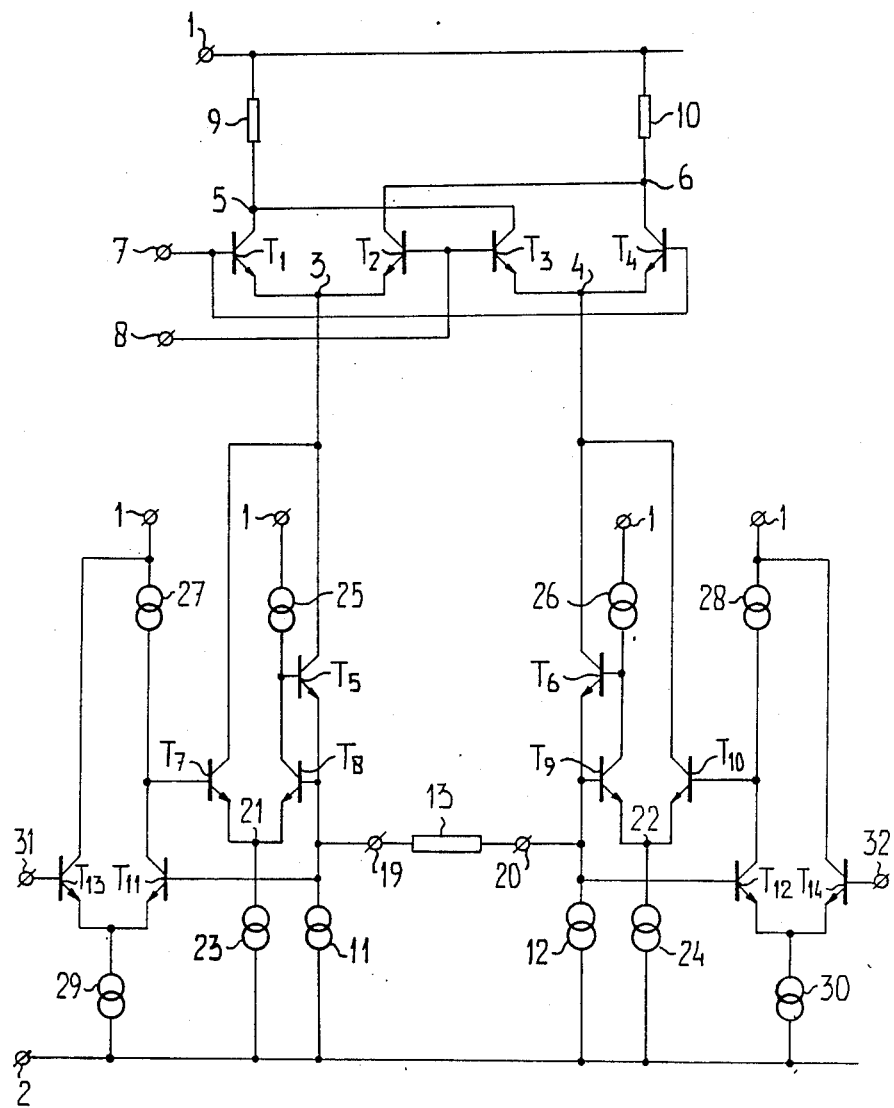
FIG. 5 is a basic circuit diagram of a double-balanced mixer circuit with a further voltage-current converter according to the invention.

However, if a stable high input impedance is necessary, the transistors $T_{11}$ and $T_{12}$ can easily be formed as components of difference pairs, for example, as is shown in FIG. 5. The emitter of transistor $T_{11}$ is connected to the emitter of a transistor $T_{13}$ and is connected to the second power supply terminal 2 via a current supply element 29. Similarly, the emitter of transistor $T_{12}$ is connected to the emitter of a transistor $T_{14}$ and to the second power supply terminal 2 via a current supply element 30. The collectors of the transistors $T_{13}$ and $T_{14}$ may be connected, as is shown, with respect to the signal current, to the first power supply terminal 1. The bases of the transistors $T_{13}$ and $T_{14}$ now constitute the high-ohmic input terminals 31, 32 of the voltage-current converter, an impedance 13 being arranged between the terminals 19 and 20 in conformity with the circuit according to FIG. 1. Otherwise, the circuit operates in the same way as described hereinbefore with reference to FIG. 4, and it can be completely integrated.

Figure 6:
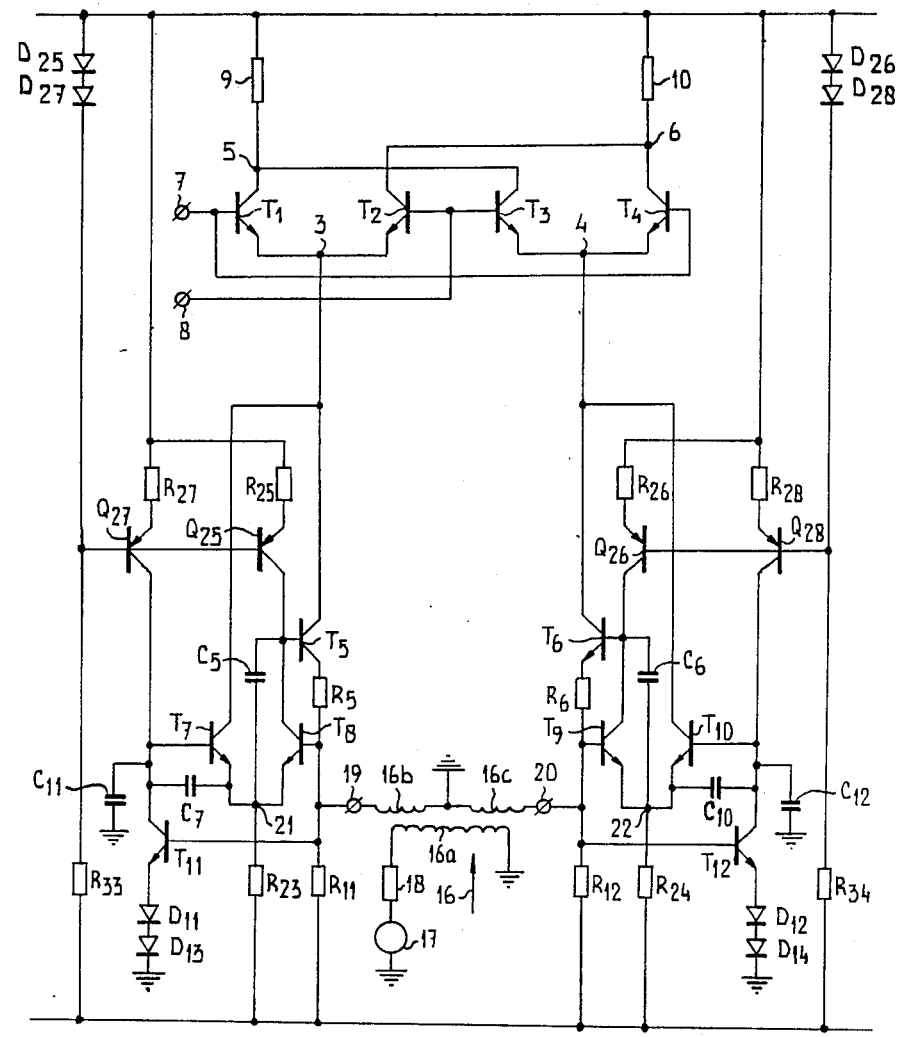
FIG. 6 is a circuit diagram of a practical version of the circuit of FIG. 4 in which capacitors are incorporated in the voltage-current converter to prevent unstable behavior of the mixer.

In the basic circuit diagram of the preferred voltage-current converter according to the invention shown in FIG. 4, two gain loops can be distinguished in each of the branches connected to the common first emitter terminal 3 and the common second emitter terminal 4, respectively, which might give rise to unstable behavior of the mixer circuit. FIG. 6 shows a practical version of the circuit of FIG. 4 in which capacitors are incorporated at various points to prevent instabilities in the circuit.

The current supply elements 25, 26, 27 and 28 are constituted by the transistors $Q_{25}$, $Q_{26}$, $Q_{27}$ and $Q_{28}$ with their respective resistors $R_{25}$, $R_{26}$, $R_{27}$ and $R_{28}$ and the diodes $D_{25}$, $D_{27}$, resistor $R_{33}$ and the diodes $D_{26}$, $D_{28}$ and resistor $R_{34}$ arranged in known manner as is shown in FIG. 6. The current supply elements 11, 12, 23 and 24 are constituted by the resistors $R_{11}$, $R_{12}$, $R_{23}$ and $R_{24}$, respectively. Series arrangements of two diodes $D_{11}$, $D_{13}$ and $D_{12}$, $D_{14}$ are incorporated in the emitter leads of the transistors $T_{11}$ and $T_{12}$, respectively. The connection between the emitter of transistor $T_5$ and the base of transistor $T_8$ incorporates a resistor $R_5$ and the connection between the emitter of transistor $T_6$ and the base of transistor $T_9$ incorporates a resistor $R_6$. As has been described with reference to FIG. 2, the RF input signal is applied to the input terminals 19, 20 by means of a symmetrical transformer 16.

As described in the foregoing, the transistors $T_{11}$ and $T_{12}$ essentially constitute broadband operational amplifiers which are negatively fed back by means of the third and the fourth difference pairs, respectively. To maintain the stability of these back loops, the collector of transistor $T_{11}$ s connected to ground by means of a capacitor $C_{11}$ and the collector of transistor $T_{12}$ is connected to ground by means of a capacitor $C_{12}$. The total bandwidth is laid down by these capacitors and the effective transductance of the transistors $T_{11}$ and $T_{12}$. The parasitic capacitances which are always present in the circuit already have some stabilizing effect corresponding to the influence of $C_{11}$ and $C_{12}$.

Essentially, three frequency-dependent impedances can be distinguished at the bases of each of the transistors $T_5$ and $T_6$, namely the collector impedance of the transistors $T_8$, $T_9$, the impedance of the current supply elements 25, 26 and the input impedance of the transistors $T_5$ and $T_6$ themselves. Together with the parasitic capacitances which are present, these impedances give rise overall to a relatively large time constant which produces a first corner frequency $f_1$ in the frequency characteristic of the open loop again, The time constant of the transistors $T_5$, $T_6$ themselves produces a second corner frequency $f_2$ in the frequency characteristic in which $f_2$ is larger than $f_1$. In the case of full negative feedback, that is to say transistor $T_5$ drives transistor $T_8$ and transistor $T_6$ drives transistor $T_9$, a phase shift of 180° at unity gain may occur at the frequency $f_2$.

This loop can be rendered stable by increasing the first time constant so that the dominant corner frequency $f_1$ shifts to a lower value and the gain at the second corner frequency $f_2$ becomes smaller than one so that the loop becomes stable. An increase in the time constant at the bases of the transistors $T_5$ and $T_6$ is realized by means of capacitors $C_5$, $C_6$ arranged between these bases and the first emitter terminal 21 and the second emitter terminal 22, respectively.

In principle, these capacitors may alternatively be arranged between the bases of the transistors $T_5$ and $T_6$ and ground. However, the currents flowing through the respective capacitors, which currents are not linear due to the base-emitter voltages, are then added to the collector currents of the respective transistors $T_5$ and $T_6$ via $T_7$, $T_8$ and $T_9$, $T_{10}$, respectively, but they do not flow in their emitter leads, which may give rise to distortion. By connecting the relevant capacitors $C_5$ and $C_6$ to the first emitter terminal 21 and the second emitter terminal 22, respectively, the currents therethrough flow in closed loops constituted by the capacitor $C_5$ and the transistor $T_8$, and the capacitor $C_6$ and the transistor $T_9$, respectively. The signal currents flowing in the collector terminals of the voltage-current converter then remain equal, according to the invention, to the respective signal currents in the emitter leads of the respective transistors $T_5$ and $T_6$.

The relatively poor RF properties of the transistors $T_7$ and $T_{10}$ arranged as emitter followers may be improved by capacitors $C_7$ and $C_{10}$ arranged between their respective bases and emitters. For RF signals, the capacitors $C_7$ and $C_{10}$ constitute so-called "feed forward" capacitances in the feedback loops constituted by $C_7$, $C_5$, $T_5$ and $C_{10}$, $C_6$, $T_6$, respectively.

The symmetrical transformer 16, used in FIG. 6 for giving the signal source having one side grounded a floating nature, can be replaced by a differential amplifier having a so-called differential output. The diodes $D_{11}$, $D_{13}$ and $D_{12}$, $D_{14}$ may alternatively be replaced by a single diode screen pair or may be decoupled for signal currents.

The use of the transformer 16 shown in FIG. 6 for a non-floating signal source can be avoided by connecting one of the input terminals 31 or 32 to ground in the circuit according to FIG. 5 and connecting the signal source 17 having one side grounded to the other, free input terminal.

In the embodiment of the invention shown all transistors are NPN transistors. Instead, PNP transistors may of course be used which transistors, however, have a poorer RF behavior than NPN transistors in an integrated circuit. It is of course also possible to use field effect transistors instead of bipolar transistors and to replace the terms emitter, collector and base in this Application by the terms source, drain and gate, respectively. It is also possible to incorporate resistors and capacitors for decoupling at various locations in the circuit or to obtain certain other desired properties, all this within the scope of the invention as defined by the claims.

Although the voltage-current converter according to the invention has been described hereinbefore with reference to its use in a double-balanced mixer circuit, it is of course not limited thereto as far as its fields of use are concerned. Other fields of use are, for example, automatic gain control circuits, impedance converters, etc.

What is claimed is:

1. A balanced voltage-current converter comprising a first and a second transistor having collectors constituting a first and a second collector terminal, respectively, for a load circuit connected to a common first power supply terminal, and having emitters coupled to a common second power supply terminal by means of respective current supply elements, said emitters constituting inputs of the voltage-current converter, characterized in that the voltage-current converter also comprises a first difference pair comprising a third and a fourth transistor having emitters connected to a common first emitter terminal, and a second difference pair comprising a fifth and a sixth transistor having emitters connected to a common second emitter terminal, said common first and second emitter terminals being connected to the second power supply terminal by means of respective current supply elements, the bases of the fourth and the fifth transistors being coupled to the emitters of the first and the second transistors, respectively, the collectors of the third and the sixth transistors being coupled to the first and second collector terminals, respectively, and the collectors of the fourth and the fifth transistors being coupled to the bases of the first and the second transistors, respectively, collectors of the fourth and the fifth transistors being connected to the first power supply terminal by means of respective current supply elements.

2. A balanced voltage-current converter as claimed in claim 1, characterized in that the bases of the third and the sixth transistors are at a fixed potential, with respect to signal currents, via a seventh and an eighth transistor, respectively, having emitters coupled to ground, the bases of the third and the sixth transistors being connected to collectors of the seventh and the eighth transistors, respectively, the collectors of the seventh and the eighth transistors being connected to the first power supply terminal by means of respective current supply elements, and bases of the seventh and the eighth transistors being connected to the bases of the fourth and the fifth transistors, respectively.

3. A balanced voltage-current converter as claimed in claim 1, characterized in that the emitters of the first and the second transistors are connected together by means of an impedance, and in that the converter further comprises a third and a fourth difference pair, said third and said fourth difference pairs comprising a seventh and a ninth and an eighth and a tenth transistor, respectively, the emitters of the transistors in each difference pair being connected together and to the second power supply terminal via respective current supply elements, the bases of the third and the sixth transistors being connected to the collectors of the seventh and the eighth transistors, the collectors of the seventh and the eighth transistors being connected to the first power supply terminal by means of respective current supply elements, the bases of the seventh and the eighth transistors being connected to the bases of the fourth and the fifth transistors, respectively, the collectors of the ninth and the tenth transistors being coupled to the first power supply terminal, and the bases of the ninth and the tenth transistors constituting input terminals of the voltage-current converter.

4. A balanced voltage-current converter as claimed in claim 1, 2 or 3, characterized in that elements having a transistor and the first common emitter terminal and between the base of the second transistor and the second common emitter terminal, respectively.

5. A balanced voltage-current converter as claimed in claim 2 or 3, characterized in that the collectors of the seventh and the eighth transistors are each connected to ground by means of elements having a capacitive action.

6. A balanced voltage-current converter as claimed in claim 1, 2 or 3, characterized in that elements having a capacitive action are arranged between the base of the third transistor and the first common emitter terminal and between the base of the sixth transistor and the second common emitter terminal, respectively.

7. A double-balanced mixer circuit comprising a balanced voltage-current converter comprising a first and a second transistor having collectors constituting a first and a second collector terminal, respectively, for a load circuit connected to a common first power supply terminal, and having emitters coupled to a common second power supply terminal by means of respective current supply elements, said emitters constituting inputs of the voltage-current converter, characterized in that the voltage-current converter also comprises a first difference pair comprising a third and a fourth transistor having emitters connected to a common first emitter terminal, and a second difference pair comprising a fifth and a sixth transistor having emitters connected to a common second emitter terminal, said common first and second emitter terminals being connected to the second power supply terminal by means of respective current supply elements, the bases of the fourth and the fifth transistors being coupled to the emitters of the first and the second transistors, respectively, the collectors of the third and the sixth transistors being coupled to the first and second collector terminals, respectively, and the collectors of the fourth and the fifth transistors being coupled to the bases of the first and the second transistors, respectively, collectors of the fourth and the fifth transistors being connected to the first power supply terminal by means of respective current supply elements, and said load circuit comprising a third difference pair comprising a seventh and an eighth transistor having emitters connected together and constituting a common third emitter terminal, and a fourth difference pair comprising a ninth and a tenth transistor having emitters connected together and constituting a common fourth emitter terminal, the collectors of the seventh and the ninth transistors being connected together and constituting a common third collector terminal, the collectors of the eighth and the tenth transistors being connected together and constituting a common fourth collector terminal, each of the common third and fourth collector terminals being connected to the common first power supply terminal by means of an impedance, the bases of the seventh and the tenth transistors being connected to a common base terminal, the bases of the eighth and the ninth transistors being connected to a common further base terminal, and said common base terminals constituting further inputs of the balanced voltage-current converter.

8. A balanced voltage-current converter comprising a first and a second transistor having collectors constituting a first and a second collector terminal, respectively, for a load circuit connected to a common first power supply terminal, and having emitters coupled to a common second power supply terminal by means of respective current supply elements, said emitters constituting inputs of the voltage-current converter, characterized in that the voltage-current converter also comprises a first difference pair comprising a third and a fourth transistor having emitters connected to a common first emitter terminal, and a second difference pair comprising a fifth and a sixth transistor having emitters connected to a common second emitter terminal, said common first and second emitter terminals being connected to the second power supply terminal by means of respective current supply elements, the bases of the fourth and the fifth transistors being coupled to the emitters of the first and the second transistors, respectively, the collectors of the third and the sixth transistors being coupled to the emitters of the first and the second transistors, respectively, and the collectors of the fourth and the fifth transistors being coupled to the bases of the first and the second transistors, respectively, collectors of the fourth and the fifth transistors being connected to the first power supply terminal by means of respective current supply elements.

9. A balanced voltage-current converter as claimed in claim 8, characterized in that the bases of the third and the sixth transistors are at a fixed potential, with respect to signal currents, via a seventh and an eighth transistor, respectively, having emitters coupled to ground, the bases of the third and the sixth transistors being connected to collectors of the seventh and the eighth transistors, respectively, the collectors of the seventh and the eighth transistors being connected to the first power supply terminal by means of respective current supply elements, and base of the seventh and the eighth transistors being connected to the bases of the fourth and the fifth transistors, respectively.

10. A balanced voltage-current converter as claimed in claim 8, characterized in that the emitters of the first and the second transistors are connected together by means of an impedance, and in that the converter further comprises a third and a fourth difference pair, said third and said fourth difference pairs comprising a seventh and a ninth and an eighth and a tenth transistor, respectively, the emitters of the transistors in each difference pair being connected together and to the second power supply terminal via respective current supply elements, the bases of the third and the sixth transistors being, connected to the collectors of the seventh and the eighth transistors, the collectors of the seventh and the eighth transistors being connected to the first power supply terminal by means of respective current supply elements, the bases of the seventh and the eighth transistors being connected to the bases of the fourth and the fifth transistors, respectively, the collectors of the ninth and the tenth transistors being coupled to the first power supply terminal, and the bases of the ninth and the tenth transistors constituting input terminals of the voltage-current converter.

11. A balanced voltage-current converter as claimed in claim 8, 9 or 10, characterized in that elements having a capacitive action are arranged between the base of the first transistor and the first common emitter terminal and between the base of the second transistor and the second common emitter terminal, respectively.

12. A balanced voltage-current converter as claimed in claim 9 or 10, characterized in that the collectors of the seventh and the eighth transistors are each connected to ground by means of elements having a capacitive action.

13. A balanced voltage-current converter as claimed in claim 8, 9 or 10, characterized in that elements having a capacitive action are arranged between the base of the third transistor and the first common emitter terminal and between the base of the sixth transistor and the second common emitter terminal, respectively.

14. A double-balanced mixer circuit comprising a balanced voltage-current converter comprising a first and a second transistor having collectors constituting a first and a second collector terminal, respectively, for a load circuit connected to a common first power supply terminal, and having emitters coupled to a common second power supply terminal by means of respective current supply elements, said emitters constituting inputs of the voltage-current converter, characterized in that the voltage-current converter also comprises a first difference pair comprising a third and a fourth transistor having emitters connected to a common first emitter terminal, and a second difference pair comprising a fifth and a sixth transistor having emitters connected to a common second emitter terminal, said common first and second emitter terminals being connected to the second power supply terminal by means of respective current supply elements, the bases of the fourth and the fifth transistors being coupled to the emitters of the first and the second transistors, respectively, the collectors of the third and the sixth transistors being coupled to the emitters of the first and the second transistors, respectively, and the collectors of the fourth and the fifth transistors being coupled to the bases of the first and the second transistors, respectively, collectors of the fourth and the fifth transistors being connected to the first power supply terminal by means of respective current supply elements, and said load circuit comprising a third difference pair comprising an seventh and an eighth transistor having emitters connected together and constituting a common third emitter terminal, and a fourth difference pair comprising a ninth and a tenth transistor having emitters connected together and constituting a common fourth emitter terminal, the collectors of the seventh and the ninth transistors being connected together and constituting a common third collector terminal, the collectors of the eighth and the tenth transistors being connected together and constituting a common fourth collector terminals being connected to the common first power supply terminal by means of an impedance, the bases of the seventh and the tenth transistors being connected to a common base terminal, the bases of the eighth and the ninth transistors being connected to a common further base terminal, and said common base terminals constituting further inputs of the balanced voltage-current converter.

* * * * *